US009607687B2

(12) United States Patent
Kolar et al.

(10) Patent No.: US 9,607,687 B2
(45) Date of Patent: *Mar. 28, 2017

(54) DUAL-PORT STATIC RANDOM ACCESS MEMORY (SRAM)

(71) Applicant: Intel Corporation, Santa Clara, CA (US)

(72) Inventors: Pramod Kolar, Hillsboro, OR (US); Gunjan H. Pandya, Portland, OR (US); Uddalak Bhattacharya, Beaverton, OR (US); Zheng Guo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/948,196

(22) Filed: Nov. 20, 2015

(65) Prior Publication Data

US 2016/0078926 A1     Mar. 17, 2016

Related U.S. Application Data

(62) Division of application No. 13/842,086, filed on Mar. 15, 2013, now Pat. No. 9,208,853.

(51) Int. Cl.
| | |
|---|---|
| *G11C 11/40* | (2006.01) |
| *G11C 11/419* | (2006.01) |
| *G11C 8/16* | (2006.01) |
| *G11C 11/412* | (2006.01) |

(52) U.S. Cl.
CPC .............. *G11C 11/419* (2013.01); *G11C 8/16* (2013.01); *G11C 11/412* (2013.01)

(58) Field of Classification Search
CPC ........................................................ G11C 11/40
USPC ........................................................ 365/154
See application file for complete search history.

(56) References Cited

U.S. PATENT DOCUMENTS

| | | | | |
|---|---|---|---|---|
| 6,111,780 A | * | 8/2000 | Bertin | ................. G11C 11/4125 |
| | | | | 257/E27.099 |
| 6,584,030 B2 | * | 6/2003 | Marr | ..................... G11C 11/417 |
| | | | | 365/189.09 |
| 2004/0080881 A1 | * | 4/2004 | Chou | ..................... H02H 9/046 |
| | | | | 361/56 |

(Continued)

OTHER PUBLICATIONS

Static Random-access Memory, Wikipedia, http://en.wikipedia.org/wiki/Static_random_access_memory, Jan. 28, 2013, 6 pages.

(Continued)

*Primary Examiner* — Min Huang
(74) *Attorney, Agent, or Firm* — Blakely, Sokoloff, Taylor & Zafman LLP

(57) ABSTRACT

In one embodiment, a memory cell circuit for storing data includes a pair of cross-coupled inverters for storing states of the memory cell circuit. Access devices provide access to the pair of cross-coupled inverters. The memory cell circuit also includes a set of electrically inactive p-type metal oxide semiconductor (PMOS) devices that are coupled to the pair of cross-coupled inverters. The set of electrically inactive PMOS devices in combination with a portion (e.g., PMOS devices) of the pair of cross-coupled inverters enables a continuous p-type diffusion layer for the memory cell circuit.

22 Claims, 6 Drawing Sheets

(56) References Cited

U.S. PATENT DOCUMENTS

| | | | |
|---|---|---|---|
| 2006/0233016 A1* | 10/2006 | Sohn | G11C 11/419 |
| | | | 365/154 |
| 2007/0002617 A1 | 1/2007 | Houston et al. | |
| 2007/0279965 A1 | 12/2007 | Nakazato et al. | |
| 2010/0103719 A1 | 4/2010 | Lee | |
| 2010/0259311 A1* | 10/2010 | Yang | H03K 19/01852 |
| | | | 327/333 |
| 2011/0026312 A1* | 2/2011 | Asayama | G11C 11/412 |
| | | | 365/154 |
| 2011/0075470 A1 | 3/2011 | Liaw | |
| 2011/0110146 A1* | 5/2011 | Ozawa | G11C 11/412 |
| | | | 365/154 |
| 2013/0088913 A1* | 4/2013 | Liu | G11C 8/08 |
| | | | 365/156 |

OTHER PUBLICATIONS

*International Search Report and Written Opinion of the International Searching Authority for PCT/US2014/019081* mailed Jun. 19, 2014, 11 pages.

Nii, Koji, et al., "A 90 nm Dual-Port SRAM with 2.04μm2 8T-Thin Cell Using Dynamically-Controlled Column Bias Scheme", *2004 IEEE International Solid-State Circuits Conference*, Feb. 18, 2004, 10 pages.

Nii, Koji, et al., "Synchronous Ultra-High-Density 2RW Dual-Port 8T-SRAM with Circumvention of Simultaneous Common-Row-Access", *IEEE Journal of Solid-State Circuits*, vol. 44, No. 3, Mar. 2009.

\* cited by examiner

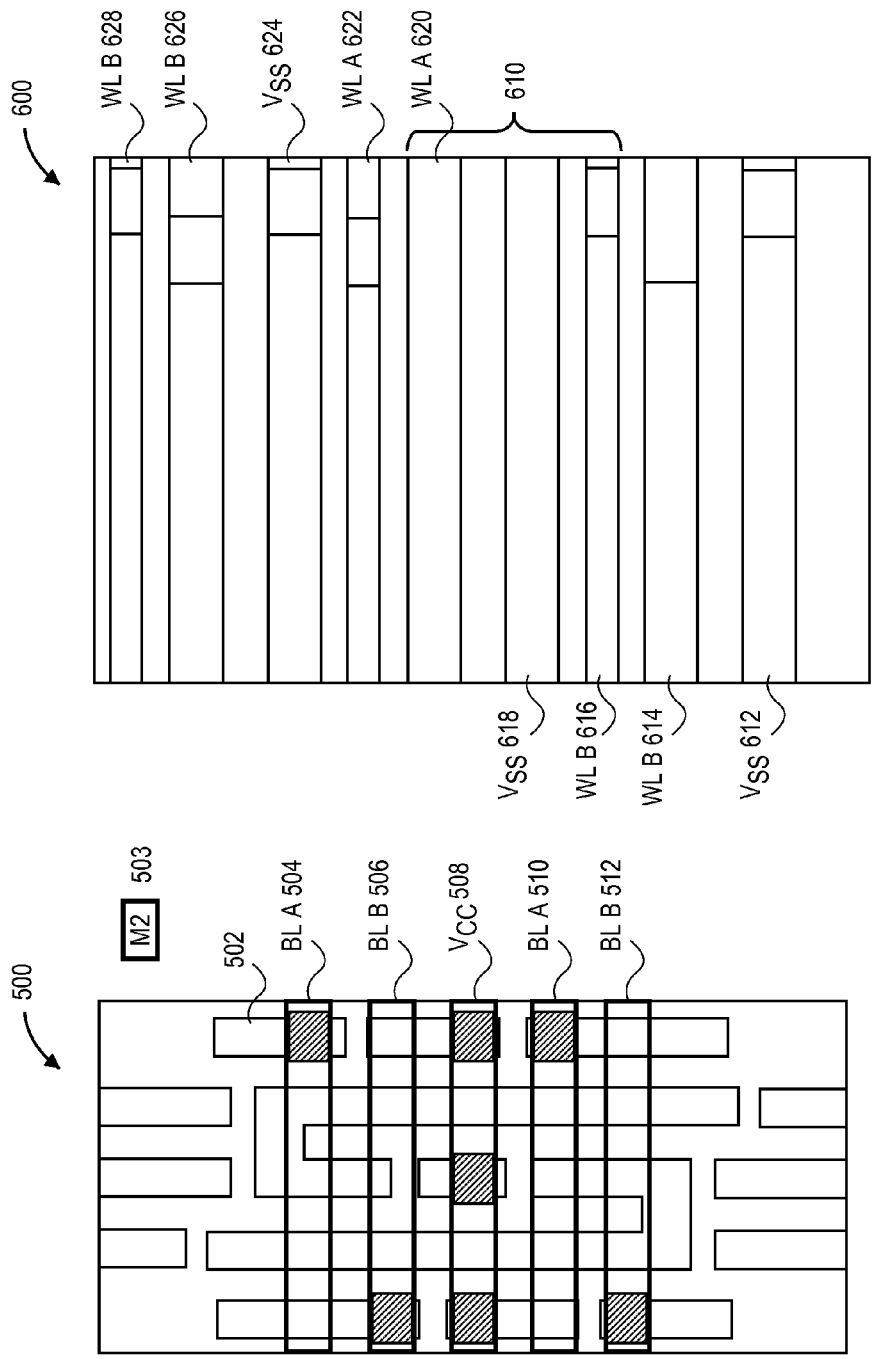

DUAL-PORT STATIC RANDOM ACCESS MEMORY (SRAM)

RELATED APPLICATIONS

This application is a divisional of U.S. application Ser. No. 13/842,086, filed on Mar. 15, 2013, the entire contents of which is hereby incorporated by reference.

TECHNICAL FIELD

Embodiments described herein generally relate to dual-port static random access memory (SRAM) arrays.

BACKGROUND

Improving the yield and reliability of memory arrays such as static random access memory (SRAM) arrays are among current design challenges of integrated circuits and microprocessors with large on-die caches. Embedded memory may include single-port SRAM, which has one access port for reading and writing operations, or multi-port SRAM that can provide high-speed communications and image processing. The multi-port SRAM is suitable for parallel operation and improves chip performance. High-performance and low-power multi-core processors have multiple CPUs within a die, which leads to the number of memory accesses increases considerably. Thus, the memory access speed becomes a limiting factor. Demand for multi-port SRAM has increased because the multi-port SRAM can be accessed from multiple ports simultaneously.

One prior approach is a dual-port bitcell implementation that includes a 2 poly-track bitcell (similar to 6 transistor bit cell) with jogged diffusion to obtain a desirable beta ratio for cell stability when both word-lines (WL) A and B are on. This results in a wide bitcell 100 of FIG. 1 with a skewed aspect ratio 4:1. However, skewed cells are not desirable as the local interconnect resistance and total WL resistance capacitance (RC) time constant are affected negatively. Jogged diffusions 110, 120, 130, and 140 of n-type diffusion or p-type diffusion layers are a patterning and reliability concern. Two WL in metal 3 (M3) have to be inserted in 2 poly tracks. This results in narrow and resistive M3 WLs. To meet performance requirements, repeaters are needed. Repeaters add additional area overhead and reduce bit density. Further, the 2 WL are adjacent to each other in M3 with no shielding in between. In the event that two adjacent WLs fire, then there is significant cross-coupling between the WLs. This can adversely impact read stability and/or the ability to write to the bitcell. In addition, due to low p-type diffusion layer density, additional filler cells may need to be added periodically. This also reduces the bit density.

BRIEF DESCRIPTION OF THE DRAWINGS

The disclosed embodiments will be better understood from a reading of the following detailed description, taken in conjunction with the accompanying figures in the drawings in which:

FIG. 5 illustrates a layout 500 of a first metal layer (metal 1) and a second metal layer (metal 2) of a memory cell circuit (e.g., bitcell) for a dual-port SRAM cell in accordance with one embodiment;

FIG. 6 illustrates a layout 600 of a third metal layer (metal 3) of a memory cell circuit (e.g., bitcell) for a dual-port SRAM cell in accordance with one embodiment.

Figure 1:
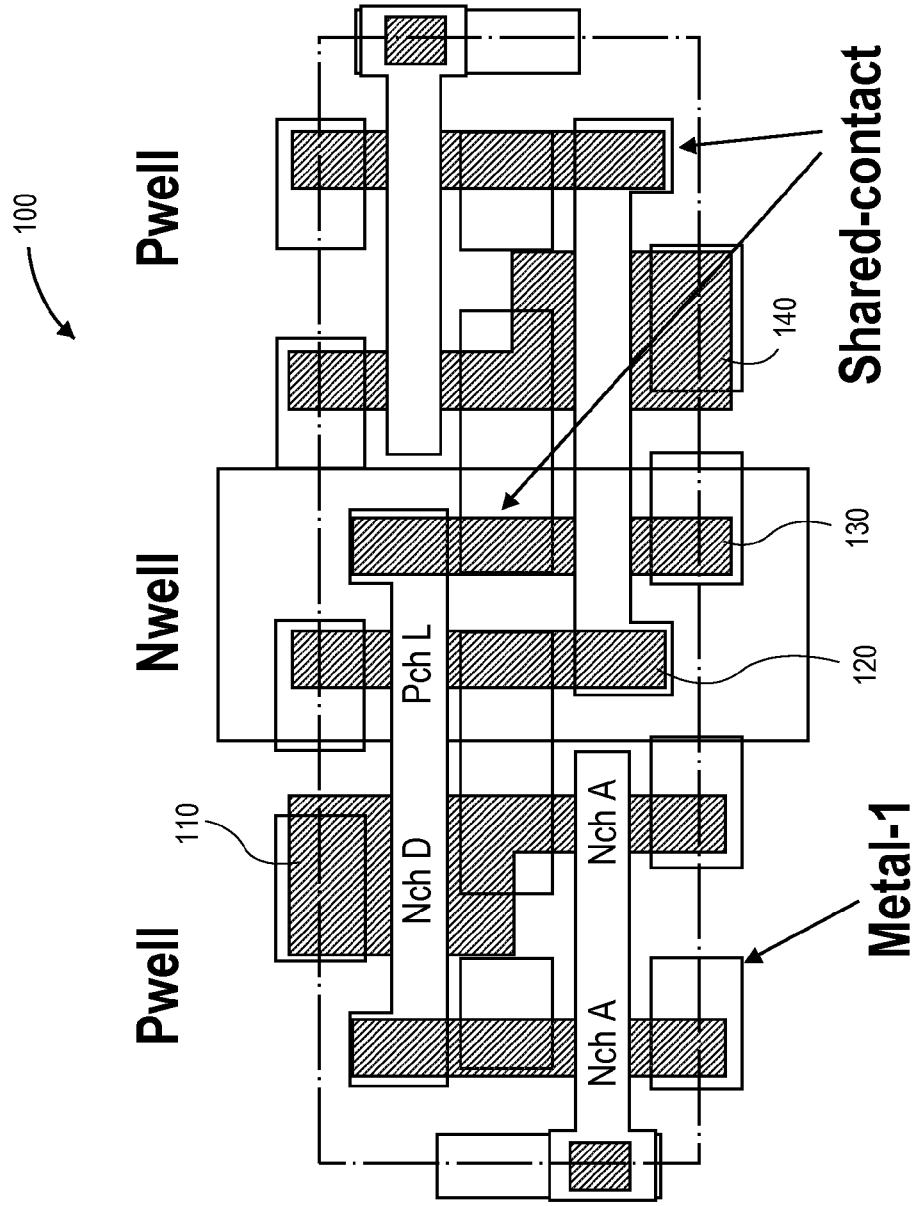
FIG. 1 illustrates a wide bitcell 100 of a dual-port SRAM in accordance with a prior approach.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements, while similar reference numerals may, but do not necessarily, denote similar elements.

DESCRIPTION OF EMBODIMENTS

In one embodiment, a memory cell circuit for storing information includes a pair of cross-coupled inverters for storing states of the memory cell circuit. Access devices are coupled to the pair of cross-coupled inverters. The access devices provide access to the pair of cross-coupled inverters. The memory cell circuit also includes a set of electrically inactive p-type metal oxide semiconductor (PMOS) devices coupled to the pair of cross-coupled inverters. The set of electrically inactive PMOS devices in combination with a portion (e.g., PMOS devices) of the pair of cross-coupled inverters to enable a continuous p-type diffusion layer for the memory cell circuit.

The memory cell circuit may be a two read/write (R/W) dual port SRAM bitcell design for storing information (e.g., data). The design may be synchronous or asynchronous. The design can be a four polysilicon track layout bitcell for supporting two R/W and two clock operations. The current bitcell design addresses the issues in the prior approach for a dual-port SRAM array. This design in one embodiment improves the aspect ratio. This design has continuous uniform n-type and p-type diffusion layers without any jogs or notches, which can help improve yield and reduce reliability concerns. The word-lines (WLs) can be wider and there can be isolation between the WLs of different ports. The need for repeaters is considerably reduced. The p-type diffusion density is increased with the unique bitcell circuit of the present design to meet processing requirements.

Figure 2:
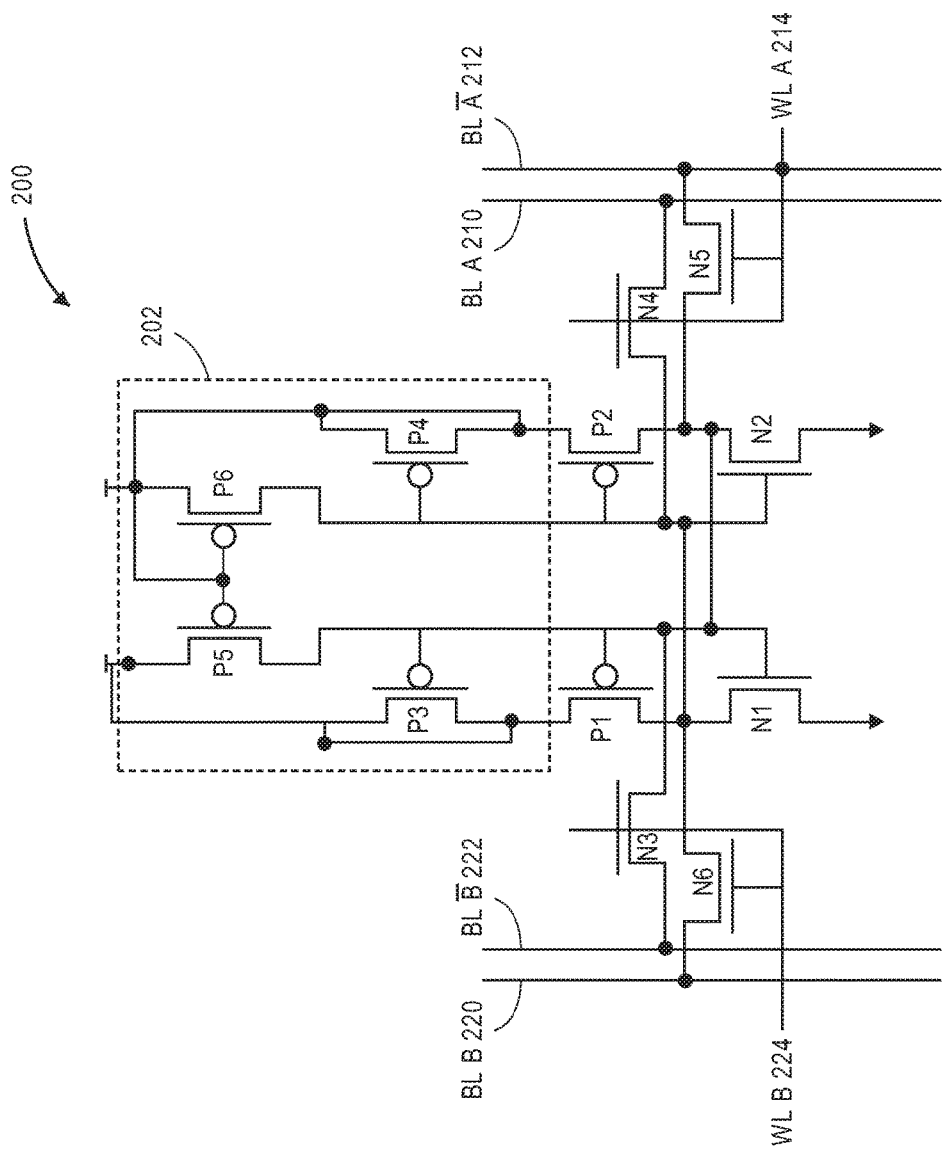
FIG. 2 illustrates a memory cell circuit (e.g., bitcell) 200 for a dual-port SRAM cell in accordance with one embodiment.

Referring now to the drawings, FIG. 2 illustrates a memory cell circuit (e.g., bitcell) 200 for a dual-port SRAM cell for storing data in accordance with one embodiment. The memory cell 200 includes electrically active PMOS devices P1 and P2, a set of electrically inactive (dummy) PMOS devices 202 (e.g., P3-P6), pull-down NMOS devices N1 and N2, and access devices (e.g., pass gate NMOS devices N3-N6). The PMOS devices P1 and P2 and NMOS devices N1 and N2 form a pair of cross-coupled inverters. The set of electrically inactive PMOS devices 202 does not affect cell function. This allows for increased p-type diffusion density to meet design rules in a continuous manner. Each bit in an SRAM is stored on the cross-coupled devices P1, P2, N1, and N2. In general, each SRAM cell is capable of storing one bit of information, and is either set to a logic high or logic low state. The access devices N3-N6 control access to the cell during read and write operations. A read assist may be needed for read operations. A read assist under drives the word line voltage to increase cell stability during a read access. Access to the cell is enabled by a word line (WL) A 214 of port A which controls the access devices N4 and N5 which, in turn, control whether the cell should be connected to the bit lines BL A 210 and BL/A 212. Access to the cell is also enabled by a word line (WL) B 224 of port B which controls the access devices N3 and N6 which, in turn, control whether the cell should be connected to the bit lines BL B 220 and BL/B 222. The bit lines are used to transfer data for both read and write operations.

The prior approach illustrating in FIG. 1 relies on a 2 poly track bitcell (i.e., two rows of polysilicon features within one dimension (e.g., a height) of a bitcell). The present design uses 4 poly tracks (i.e., four rows of polysilicon features within one dimension (e.g., a height) of a bitcell). This allows for isolation between the WL of different ports that will eliminate cross-coupling. In addition, the layout with the inactive dummy PMOS devices P3-P6 allows for continuous diffusion strips, which enhance manufacturability. The aspect ratio (width:height) of the cell is improved to 2.67 in one embodiment. This ensures that the WL RC loading for the same number of columns is better than it would be in the prior approach. Array designs using this cell will have less repeater usage. The memory cell is sized to be stable when both pass gates are ON simultaneously. The pass gate size can be increased up to a limit (e.g., increased up to half of a pull down gate size) without increasing height of the memory cell. Changes to access device size (e.g., pass gate size) in conjunction with read assist can also be done. Wider access devices have reduced random variation in the access device because random variation is inversely proportional to device area and using read assist with wider access devices helps in cell stability control. In contrast, the prior approach increases cell height for an increased pass gate size.

In a specific embodiment, P1 and P2 have a gate ratio (width:length) of x while N1 and N2 have a gate ratio of 6x. The pass gates may have a gate ratio of 3x. Various other gate ratios can be designed for the PMOS and NMOS devices. The memory cell circuit may support two R/W operations with two asynchronous clock functionality for various designs and process nodes (e.g., 22 nm node). Potential applications for this present design include at least graphics, field programmable gate arrays (FPGAs), and network processors.

Figure 3:
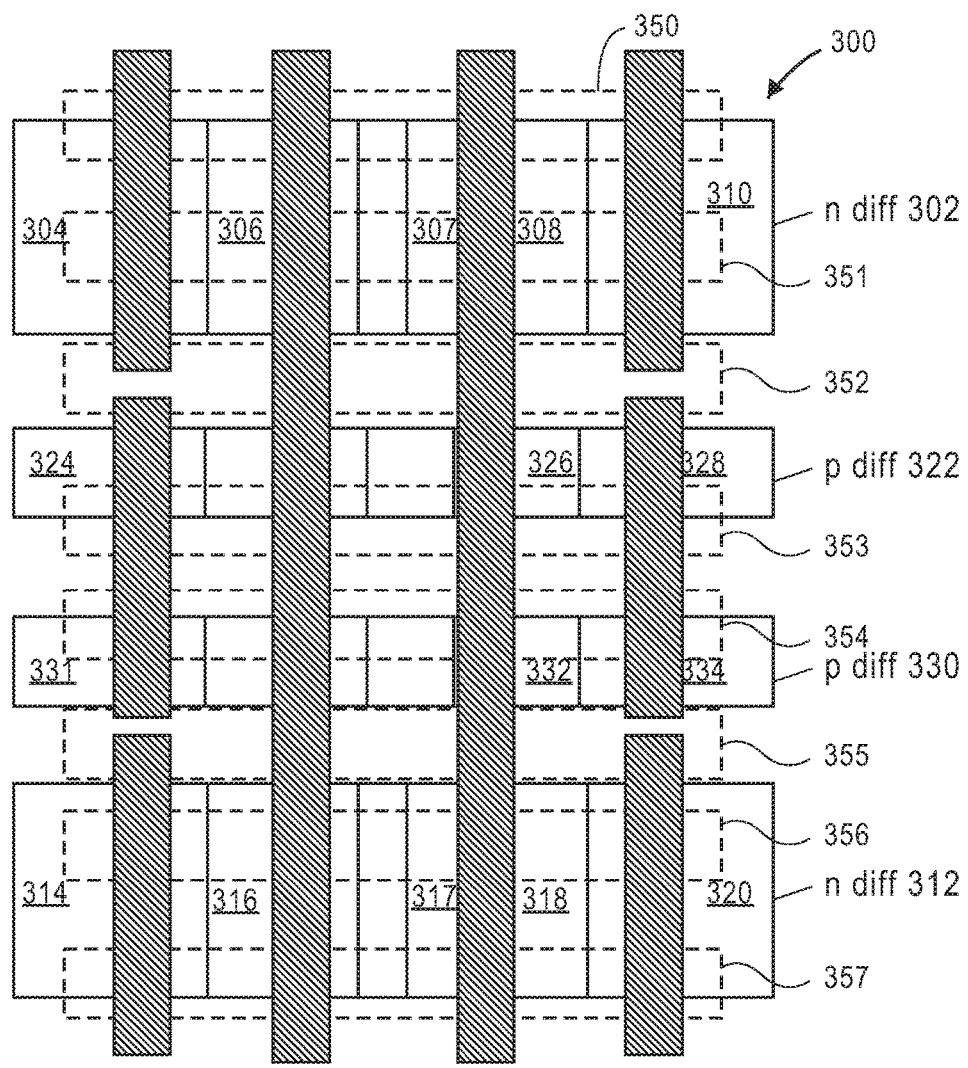
FIG. 3 illustrates a layout 300 of diffusion layers and a transistor layer of a memory cell circuit (e.g., bitcell) for a dual-port SRAM cell in accordance with one embodiment.

FIG. 3 illustrates a layout 300 of diffusion layers and a transistor layer of a memory cell circuit (e.g., bitcell) for a dual-port SRAM cell in accordance with one embodiment. The layout 300 includes n-type diffusion layer 302 having different regions including regions 302, 306, 307, 308, and 310 within the continuous layer. For example, four tracks of polysilicon for forming NMOS devices can be formed with any of the regions and transistor regions 350 and 351 (e.g., fin of a trigate pattern). A SRAM Vss can be formed with the region 307. In a similar manner, n-type diffusion layer 312 has different regions including regions 314, 316, 317, 318, and 320 within the continuous layer. For example, four tracks of polysilicon for forming NMOS devices can be formed with any of the regions and transistor regions 356 and 357. A SRAM Vss can be formed with the region 317.

The layout 300 also includes p-type diffusion layer 322 having different regions including regions 324, 326, 328 within the continuous layer. For example, four tracks of polysilicon for forming PMOS devices can be formed with any of the regions and transistor region 353 (e.g., fin of a trigate pattern). A SRAM Vcc can be formed with the regions 324 and 328. In a similar manner, p-type diffusion layer 330 has different regions including regions 330, 332, and 334 within the continuous layer. For example, four tracks of polysilicon for forming PMOS devices can be formed with any of the regions and transistor region 354. A SRAM Vcc can be formed with the regions 331 and 334. Transistor layer includes regions 350-357, which can be fins of a trigate pattern. The layout 300 has continuous diffusion layers for forming NMOS and PMOS devices which results in improved yield. A logic transistor pattern with transistor regions 350-357 is reused. The layout also reduced complexity by eliminating diffusion jogs.

Figure 4:
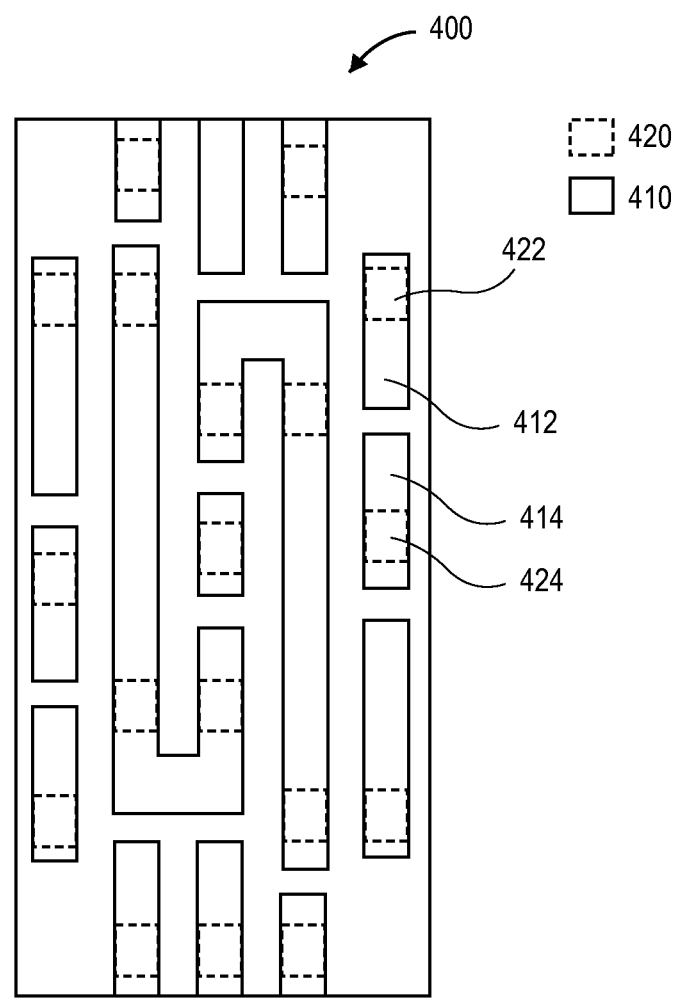
FIG. 4 illustrates a layout 400 of a first metal layer (metal 1) and a first via layer of a memory cell circuit (e.g., bitcell) for a dual-port SRAM cell in accordance with one embodiment.

FIG. 4 illustrates a layout 400 of a first metal layer (metal 1) and a first via layer of a memory cell circuit (e.g., bitcell) for a dual-port SRAM cell in accordance with one embodiment. The layout 400 includes a via layer 420 having different via regions including regions 422 and 424. A first metal layer 410 includes different metal 1 regions including regions 412 and 414. A clean J-shaped Metal pattern is formed within design rules that ensure that all vias are self-aligned to the metal 1 for process robustness.

FIG. 5 illustrates a layout 500 of a first metal layer (metal 1) and a second metal layer (metal 2) of a memory cell circuit (e.g., bitcell) for a dual-port SRAM cell in accordance with one embodiment. The layout 500 includes a first metal layer 520 having different metal regions. A second metal layer 503 includes different metal 2 regions including regions BL A 504, BL B 506, Vcc 508, BL A 510, and BL B 512. Metal 2 bit lines of a first port (port A) are isolated from metal 2 bit lines of a second port (port B) with Vcc 508.

FIG. 6 illustrates a layout 600 of a third metal layer (metal 3) of a memory cell circuit (e.g., bitcell) for a dual-port SRAM cell in accordance with one embodiment. The layout 600 includes a third metal layer 520 having different metal regions including regions WL B 628, WL B 626, Vss 624, WL A 624, WL A 622, WL A 620, Vss 618, WL B 616, WL B 614, and Vss 612. In one embodiment, WL A 620, Vss 618, and WL B 616 illustrate the third metal layer 610 for a memory cell circuit. A four track polysilicon cell allows for wider metal 3 than for a two polysilicon track cell. The four track cell in comparison to a two track cell has a lower word line resistance, a lower word line capacitance due to wider spacing, needs fewer repeaters, which reduces circuit area and delay, for isolation performance, allows for word line isolation between ports by having Vss in between the ports, and increases robustness of a Vss grid.

Figure 7:
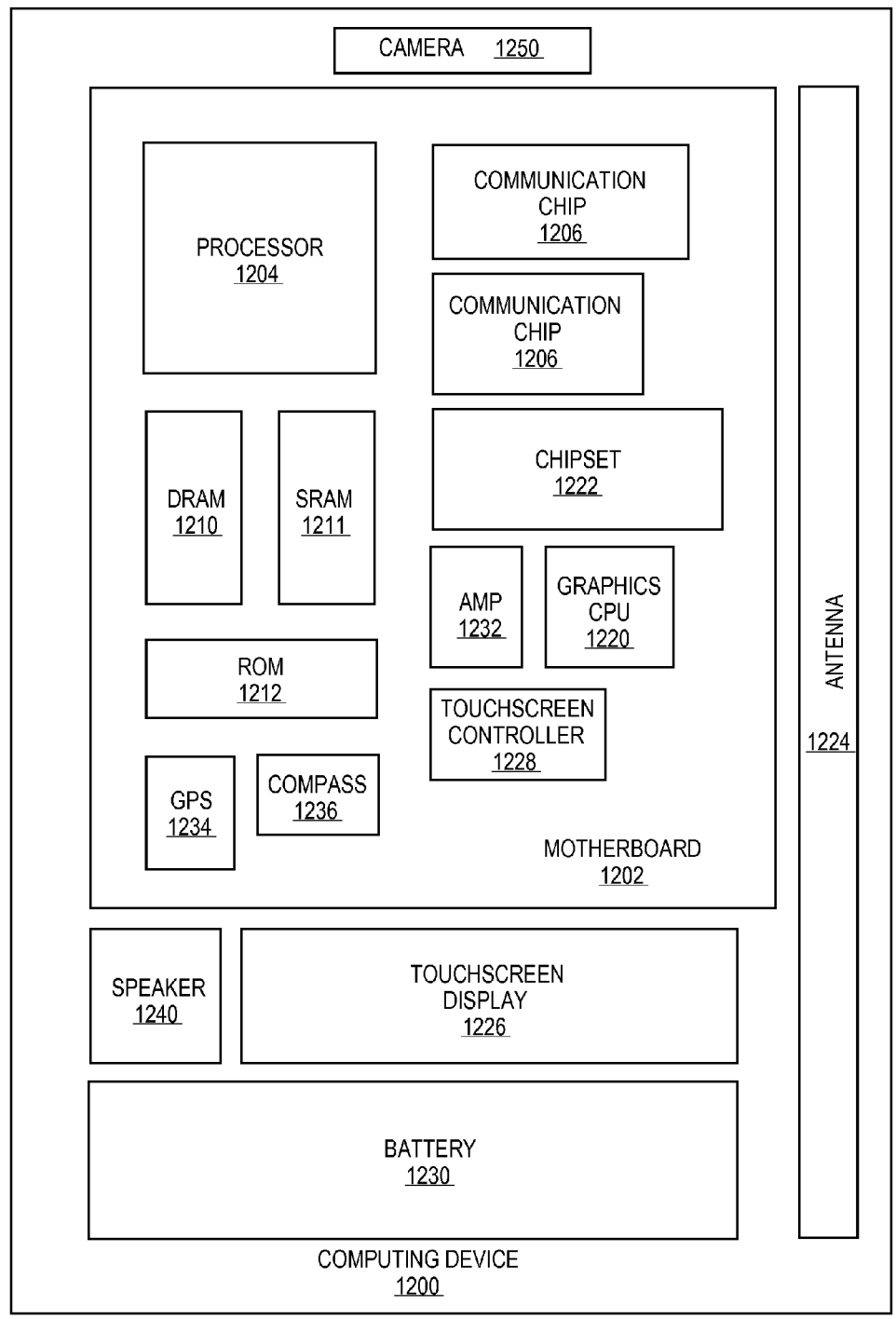
FIG. 7 illustrates a computing device 1200 in accordance with one embodiment.

FIG. 7 illustrates a computing device 1200 in accordance with one embodiment. The computing device 1200 houses a board 1202. The board 1202 may include a number of components, including but not limited to a processor 1204 and at least one communication chip 1206. The processor 1204 is physically and electrically coupled to the board 1202. In some implementations the at least one communication chip 1206 is also physically and electrically coupled to the board 1202. In further implementations, the communication chip 1206 is part of the processor 1204.

Depending on its applications, computing device 1200 may include other components that may or may not be physically and electrically coupled to the board 1202. These other components include, but are not limited to, volatile memory (e.g., DRAM 1210), non-volatile memory (e.g., ROM 1212), SRAM 1212 with one or more arrays of memory cell circuits (e.g., memory cell circuit 200), flash memory, a graphics processor 1220, a digital signal processor, a crypto processor, a chipset 1222, an antenna 1224, a display, a touchscreen display 1226, a touchscreen controller 1228, a battery 1230, an audio codec, a video codec, a power amplifier 1232, a global positioning system (GPS) device 1234, a compass 1236, an accelerometer, a gyroscope, a speaker 1240, a camera 1250, and a mass storage device (such as hard disk drive, compact disk (CD), digital versatile disk (DVD), and so forth).

The communication chip 1206 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing device 1200 includes an integrated circuit die packaged within the processor 1204. In some embodiments of the invention, the integrated circuit die of the processor includes one or more memory cell circuits that are formed in accordance with implementations of the invention. The term "processor" may refer to any device or portion of a device that processes electronic data from registers and/or memory to transform that electronic data into other electronic data that may be stored in registers and/or memory.

The communication chip 1206 also includes an integrated circuit die packaged within the communication chip 1206. In accordance with another embodiment of the invention, the integrated circuit die of the communication chip includes one or more memory cell circuits that are formed in accordance with implementations of the invention.

In further embodiments, another component housed within the computing device 1200 may contain an integrated circuit die that includes one or more memory cell circuits that are formed in accordance with implementations of the invention.

In various implementations, the computing device 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

The following examples pertain to further embodiments. Example 1 is a memory cell circuit for storing data that includes a pair of cross-coupled inverters for storing states of the memory cell circuit and a plurality of access devices that are coupled to the pair of cross-coupled inverters. The access devices provide access to the pair of cross-coupled inverters. The memory cell circuit also includes a set of electrically inactive p-type metal oxide semiconductor (PMOS) devices that are coupled to the pair of cross-coupled inverters. The set of electrically inactive PMOS devices in combination with a portion of the pair of cross-coupled inverters enable a continuous p-type diffusion layer for the memory cell circuit. In Example 2, the electrically inactive PMOS devices increase a density of the p-type diffusion layer. In Example 3, a size of at least one access device is increased up to a limit without increasing a height of the memory cell circuit. A read assist may be used in conjunction with increasing the size of at least one access device. In Example 4, the subject matter of any one of Examples 1-3 can optionally include the set of electrically inactive PMOS devices including four PMOS devices. In Example 5, the subject matter of any one of Examples 1-4 can optionally include a bit line of a first port and a bit line of a second port that are coupled to the plurality of access devices. The bit lines transfer data during read and write operations to the pair of cross-coupled inverters. In Example 6, the subject matter of Example 5 can optionally include a Vcc line that is coupled to the pair of cross-coupled inverters. The Vcc line isolates the bit line of the first port from the bit line of the second port. In Example 7, the subject matter of Example 6 can optionally include a word line of a first port that is coupled to at least one of the access devices and a word line of a second port that is coupled to at least one of the access devices. The word lines control the access devices. The memory cell circuit may include four polysilicon tracks to provide for isolation of the word line of the first port from the word line of the second port. In Example 8, the memory cell circuit of any of Examples 1-7 includes a dual-port asynchronous SRAM cell.

Example 9 is an apparatus for storing data that includes a means for storing states of the apparatus, which has p-type metal oxide semiconductor (PMOS) devices and n-type metal oxide semiconductor (NMOS) devices. The apparatus also includes a means for providing access to the apparatus and a set of electrically inactive PMOS devices that enable a continuous p-type diffusion layer for the PMOS devices of the apparatus. In Example 10, the electrically inactive PMOS devices increase a density of the p-type diffusion layer. In Example 11, the subject matter of Example 9 can optionally include the set of electrically inactive PMOS devices including at least two PMOS devices. In Example 12, the subject matter of any of Examples 9-11 can optionally include a bit line of a first port that is coupled to at least one of the NMOS and PMOS devices and a bit line of a second port that is coupled to at least one of the NMOS and PMOS devices. The bit lines transfer data during read and write operations to the PMOS and NMOS devices. In Example 13, the subject matter of any of Examples 9-12 can optionally include a Vcc line that provides power to the apparatus and that isolates the bit line of the first port from the bit line of the second port. In Example 14, the subject matter of any of Examples 9-13 can optionally include a word line of a first port that is coupled to at least one of the NMOS and PMOS devices and a word line of a second port that is coupled to at least one of the NMOS and PMOS devices. The word lines control the means for providing access to the apparatus. The means for providing access to the apparatus includes four polysilicon tracks that provide for isolation of the word line of the first port from the word line of the second port.

Example 15 is a computing device that includes a processor, a communication chip that is coupled to the processor, and one or more arrays each including a plurality of memory cell circuits for storing data. Each memory cell circuit includes a pair of inverters for storing states of each memory cell circuit, a plurality of access devices that are coupled to the pair of inverters. The access devices provide access to the pair of cross-coupled inverters. Each memory cell circuit also includes a set of electrically inactive p-type metal oxide semiconductor (PMOS) devices that are coupled to the pair of inverters. The set of electrically inactive PMOS devices enable a continuous p-type diffusion layer for each memory cell circuit. In Example 16, the electrically inactive PMOS devices to increase a density of the p-type diffusion layer. In Example 17, a size of at least one access device is increased up to a limit without increasing a height of the corresponding memory cell circuit. A read assist may be used in conjunction with increasing the size of at least one access device. In Example 18, the subject matter of Example 15 can optionally include the set of electrically inactive PMOS devices including four PMOS devices. In Example 19, the subject matter of any of Examples 15-18 can optionally include a bit line of a first port and a bit line of a second port that are coupled to the plurality of access devices. The bit lines transfer data during read and write operations to the pair of cross-coupled inverters. In Example 20, the subject matter of any of Examples 15-19 can optionally include a Vcc line that is coupled to the pair of cross-coupled inverters. The Vcc line isolates the bit line of the first port from the bit line of the second port. In Example 21, the subject matter of any of Examples 15-20 can optionally a word line of a first port that is coupled to at least one of the access devices and a word line of a second port that is coupled to at least one of the access devices. The word lines control the access devices. At least one memory cell circuit may include four polysilicon tracks to provide for isolation of the word line of the first port from the word line of the second port. In Example 22, at least one memory cell circuit of any of Examples 15-21 includes a dual-port asynchronous SRAM cell.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the energy storage devices and the related structures and methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A memory cell circuit for storing data, comprising:
   a plurality of p-type metal oxide semiconductor (PMOS) devices and a plurality of n-type metal oxide semiconductor (NMOS) devices for storing states of the memory cell circuit;
   a plurality of access devices with each access device being coupled to at least one of the plurality of PMOS devices and at least one of the plurality of NMOS devices, the plurality of access devices to provide access for storing states of the memory cell circuit; and
   a set of electrically inactive p-type metal oxide semiconductor (PMOS) devices coupled to the plurality of PMOS devices, the set of electrically inactive PMOS devices in combination with the plurality of PMOS devices to enable a continuous p-type diffusion layer for the memory cell circuit, wherein a gate of a first electrically inactive PMOS device is coupled to a gate of a first electrically active PMOS device of the plurality of PMOS devices.

2. The memory cell circuit of claim 1, wherein the electrically inactive PMOS devices to increase a density of the p-type diffusion layer, wherein the gate of the first electrically inactive PMOS device is coupled to an access device of the plurality of access devices.

3. The memory cell circuit of claim 1, wherein a size of at least one access device is increased up to a limit without increasing a height of the memory cell circuit.

4. The memory cell circuit of claim 1, wherein the set of electrically inactive PMOS devices comprises four PMOS devices.

5. The memory cell circuit of claim 1, further comprising:
a bit line of a first port and a bit line of a second port coupled to the plurality of access devices, the bit lines to transfer data during read and write operations to the pair of cross-coupled inverters; and
a Vcc line coupled to the pair of cross-coupled inverters, wherein the Vcc line to isolate the bit line of the first port from the bit line of the second port.

6. The memory cell circuit of claim 1, wherein a size of at least one access device is increased up to a limit without increasing a height of the memory cell circuit in conjunction with using a read assist for read access.

7. The memory cell circuit of claim 1, further comprising:
a word line of a first port coupled to at least one of the access devices; and
a word line of a second port coupled to at least one of the access devices, the word lines to control the access devices, wherein the memory cell circuit comprises four polysilicon tracks to provide for isolation of the word line of the first port from the word line of the second port.

8. The memory cell circuit of claim 1, wherein the memory cell circuit comprises a dual-port SRAM cell.

9. An apparatus for storing data, comprising:
means for storing states of the apparatus with electrically active p-type metal oxide semiconductor (PMOS) devices and n-type metal oxide semiconductor (NMOS) devices;
means for providing access for storing states of the apparatus; and
a set of electrically inactive PMOS devices coupled to the electrically active PMOS devices, the set of electrically inactive PMOS devices in combination with the electrically active PMOS devices to enable a continuous p-type diffusion layer for the PMOS devices of the apparatus, wherein a gate of a first electrically inactive PMOS device is coupled to a gate of a first electrically active PMOS device of the plurality of PMOS devices.

10. The apparatus of claim 9, wherein the electrically inactive PMOS devices to increase a density of the p-type diffusion layer.

11. The apparatus of claim 9, wherein the set of electrically inactive PMOS devices comprises at least two PMOS devices, wherein the mean for providing access for storing states of the apparatus comprises a plurality of access devices with each access device being coupled to at least one of the electrically active PMOS devices and at least one of the NMOS devices, wherein the gate of the first electrically inactive PMOS device is coupled to an access device of the plurality of access devices.

12. The apparatus of claim 9, further comprising:
a bit line of a first port coupled to at least one of the NMOS and PMOS devices; and
a bit line of a second port coupled to at least one of the NMOS and PMOS devices, the bit lines to transfer data during read and write operations to the PMOS and NMOS devices.

13. The apparatus of claim 12, further comprising:
a Vcc line to provide power to the apparatus and to isolate the bit line of the first port from the bit line of the second port.

14. The apparatus of claim 9, further comprising:
a word line of a first port coupled to at least one of the NMOS and PMOS devices; and
a word line of a second port coupled to at least one of the NMOS and PMOS devices, the word lines to control the means for providing access to the apparatus, wherein the means for providing access to the apparatus comprises four polysilicon tracks to provide for isolation of the word line of the first port from the word line of the second port.

15. A computing device, comprising:
a processor;
a communication chip coupled to the processor; and
one or more arrays each including a plurality of memory cell circuits, each memory cell circuit comprising,
a plurality of p-type metal oxide semiconductor (PMOS) devices and a plurality of n-type metal oxide semiconductor (NMOS) devices for storing states of the memory cell circuit;
a plurality of access devices with each access device being coupled to at least one of the plurality of PMOS devices and at least one of the plurality of NMOS devices, the plurality of access devices to provide access for storing states of the memory cell circuit; and
a set of electrically inactive p-type metal oxide semiconductor (PMOS) devices coupled to the plurality of PMOS devices, the set of electrically inactive PMOS devices in combination with the plurality of PMOS devices to enable a continuous p-type diffusion layer for the memory cell circuit, wherein a gate of a first electrically inactive PMOS device is coupled to a gate of a first electrically active PMOS device of the plurality of PMOS devices.

16. The computing device of claim 15, wherein the electrically inactive PMOS devices to increase a density of the p-type diffusion layer, wherein the gate of the first electrically inactive PMOS device is coupled to an access device of the plurality of access devices.

17. The computing device of claim 15, wherein a size of at least one access device is increased up to a limit without increasing a height of the corresponding memory cell circuit.

18. The computing device of claim 15, wherein the set of electrically inactive PMOS devices comprises four PMOS devices.

19. The computing device of claim 15, further comprising:
a bit line of a first port and a bit line of a second port coupled to the plurality of access devices, the bit lines to transfer data during read and write operations to the pair of cross-coupled inverters; and
a Vcc line coupled to the pair of cross-coupled inverters, wherein the Vcc line to isolate the bit line of the first port from the bit line of the second port.

20. The computing device of claim 19, wherein a size of at least one access device is increased up to a limit without increasing a height of the memory cell circuit in conjunction with using a read assist for read access.

21. The computing device of claim 15, further comprising:
a word line of a first port coupled to at least one of the access devices; and
a word line of a second port coupled to at least one of the access devices, the word lines to control the access devices, wherein at least one memory cell circuit comprises four polysilicon tracks to provide for isolation of the word line of the first port from the word line of the second port.

22. The computing device of claim 15, wherein at least one memory cell circuit comprises a dual-port SRAM cell.

\* \* \* \* \*